Sept. 9, 1969 R. A. DE ROSE 3,465,891

PRINTED CIRCUIT BOARD LIBRARY RACK

Filed June 23, 1967 2 Sheets-Sheet 1

INVENTOR
R. A. DeROSE
BY
[signature]
ATTORNEY

United States Patent Office 3,465,891
Patented Sept. 9, 1969

3,465,891

PRINTED CIRCUIT BOARD LIBRARY RACK

Ralph A. De Rose, Villa Park, Ill., assignor to International Telephone and Telegraph Corporation, a corporation of Delaware Filed June 23, 1967, Ser. No. 648,336
Int. Cl. A47g 19/08; A47f 5/00
U.S. Cl. 211—41 2 Claims

ABSTRACT OF THE DISCLOSURE

A library rack is made from pieceparts cut from stock metal having only two standard shapes. One such part is a simple strut member having a row of holes placed close enough together so that it may be cut into any length. The other part serves the dual function of providing both a strut and a guideway for the printed circuit board. There are no tapped holes, special brackets, nuts and bolts, or the like. While the entire rack may be made from these two parts, it is not rigidly limited thereto. Almost any part may be added according to the user's needs.

This invention relates to extremely low cost library racks of a type which are adaptable to receive and support almost any printed circuit boards of any convenient size—with full provisions for keying to prevent (or greatly reduce the chances that) printed circuit boards may be inserted in the wrong connectors.

Library racks are well known devices for receiving and supporting printed circuit boards. At this late date in their development, they have already been adapted to perform almost all functions which might reasonably be required in any expectable assembly. Because they have been developed to such a high state, it might appear that there is almost no room for further development. However, despite all of this prior development, there still remains a great opportunity for cost reduction, since library racks have consistantly been relatively expensive considering their cost and contribution relative to the cost and contribution of other related equipment.

Accordingly, an object of the invention is to reduce the cost of library racks. In this connection, an object is to reduce to a minimum the variety of pieceparts required to construct a library rack of almost any size and geometry. Yet, another object is to provide an almost infinite variety of size and shapes of library racks.

A further object of the invention is to provide a completely modern library rack. Here, an object is to provide racks which use any connector, keyed to preclude an incorrect insertion of the wrong printed circuit boards—regardless of the size of the printed circuit boards.

Still another object is to provide library racks which may be made on a minimum number of general purpose machines. Conversely stated, an object is to reduce tooling costs.

In keeping with an aspect of the invention, a library rack may be constructed from as few as two stock pieceparts which may be cut to any desired size and then put together quickly and easily by any suitable means such as rivets or self-tapping sheet metal screws. The only tolerances of any real significance are built into the two sets of tools and dies which make the stock parts. These tools and dies may be used on virtually any general purpose punch press having an adequate size. While the entire library rack may be made from these two stock parts, the invention is, nevertheless, flexible enough to be constructed from a number of different sizes and guages of similar parts. Thus, for example, if one wishes to use a thinner part at one location and a thicker part at another, the parts will all be compatible with each other.

The above mentioned and other features of this invention and the manner of obtaining them will become more apparent, and the invention itself will be best understood by reference to the following description of an embodiment of the invention taken in conjunction with the accompanying drawings, in which.

As those skilled in the art know, a library rack is a shelf-like arrangement for slidably receiving and supporting a plurality of vertically (or horizontally) oriented, spaced parallel, printed circuit boards. These boards are supported on the shelf much as books are supported on a shelf in a bookcase—hence the name "library rack."

Figure 1:
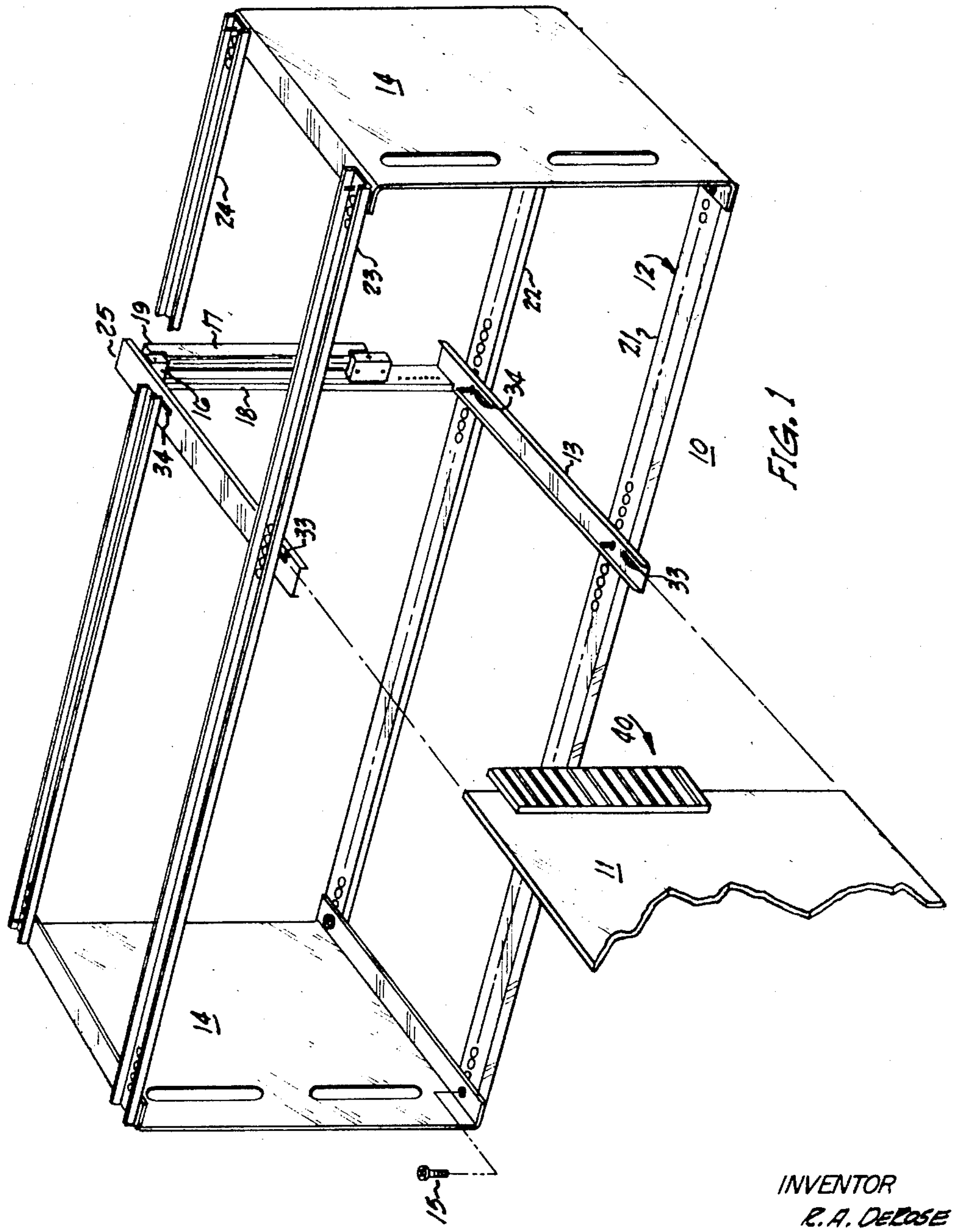
FIG. 1 is a perspective view of a library rack constructed according to the teachings of the invention.

FIG. 1 shows a single shelf 10 which may or may not be part of a larger multi-shelf rack. However, in the interest of clarity, it shows only the means for supporting a single printed circuit board 11. It should, of course, be understood this support may be duplicated any number of times to support any desired number of printed circuit boards.

Basically, the invention requires only two stock pieceparts, one being a perforated U-shaped channel iron (such as 12) and the other being a combination strut and guide plate (such as 13). This particular shelf also has end-wall pieceparts 14, 14 which provide the support for upper and lower struts or mounting rails used to complete the library rack shelf. It should be understood, however, that these end supports are shown here for convenience only. The struts forming the shelf 12 may be supported on any suitable structure used in conjunction with the library rack—such as a relay rack, cabinet, or the like. The assembly of FIG. 1 is connected together by a number of self-tapping sheet metal screws (such as 15)—there is no need for drilling and tapping the holes in any part.

One further piecepart is here shown as a mounting block 16 which may or may not be provided depending upon the nature of the connector that is used. One or more of these blocks are used to anchor a printed circuit board connector 17 at a keyed location on a vertical mounting rail or member 18. Some connectors have supporting feet which may be bolted directly into the holes in the perforated vertical member 18—in which case the mounting block 16 is omitted. Other connectors have supporting feet with holes extending at right angles to the perforations in the rail, as at 19—in which case the connector 17 is attached to the mounting block 16. It, in turn, is attached to the vertical mounting rail or member 18.

Figure 2:
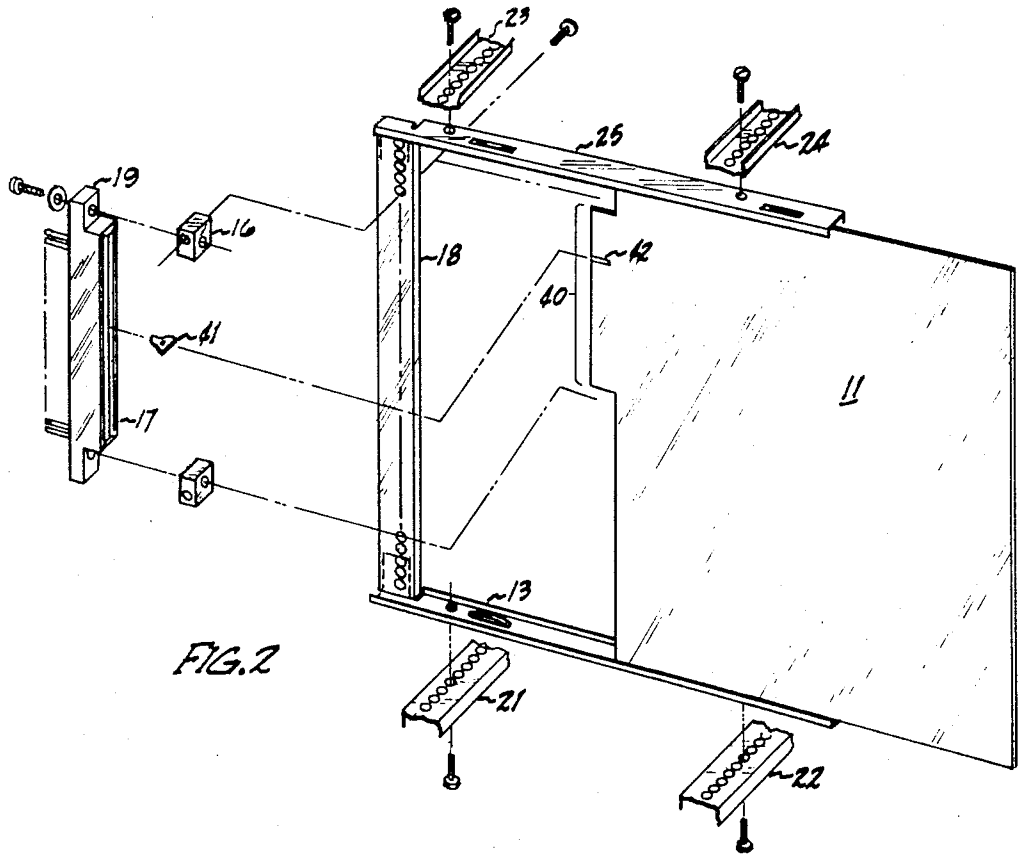
FIG. 2 is an exploded view of a connector mounting rail assembly and printed circuit board guide way.

The novel aspects of the connector mount and printed circuit board guide way is that the same two low cost pieceparts allow the rack to be made larger or smaller in any dimensions. This may be more apparent from a study of FIG. 2.

A single type of stock of metal, preferably perforated and having a U-shaped cross-section, may be stamped or cut to size. Then, it is arranged to make the horizontal shelf supports 21–24 and the vertical connector mounting bar or rail 18. The entire length of this metal stock is punched or otherwise perforated to provide a row of holes which are separated from each other by a center to center distance of, perhaps, two-tenths of an inch. Self tapping sheet metal screws, rivets, or the like may be driven through these holes to lock the various parts together.

Figure 3:
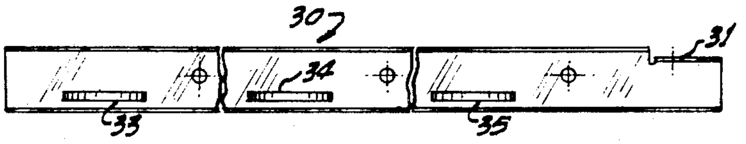
FIGS. 3–5 are, respectively, top, side, and end elevation views of a combination of struts and printed circuit board guide way.

The other piecepart is a combination strut and guide bar. These guide bars are attached to the U-shaped bars 21–24 to form a frame member, as shown. The guide bars are shown at 13, 25 in FIGS. 3–5. Each of these guide bars is an elongated piece 30 of sheet metal, again formed to have a generally U-shaped cross-section. One end of the guide bar has an upstanding tab 31. Except for the tab, there is no difference between upper and lower guide bars—and even that difference may be eliminated by a proper centering. The tab is provided with one or more holes 32 that may also be used to receive the sheet metal screws which are used to hold the frame together. For example, in the foregoing description, an assumption was made that the holes of the piecepart 18 were two-tenths of an inch apart. Therefore, the two holes 32 will also be two-tenths of an inch apart.

A number of aligned, semi-pierced, detent guides 33, 34, 35 are longitudinally positioned along the bottom of the U-shaped member. Each detent guide is parallel to and spaced away from an upstanding edge of the U-shaped channel. The distance between the detent guides and the channel edge is equal to the thickness of a printed circuit board, plus a reasonable tolerance. This way, the upper and lower edges of the printed circuit board may be slid into the rack in a position between the detent guides and the side of the rail.

Figure 4:
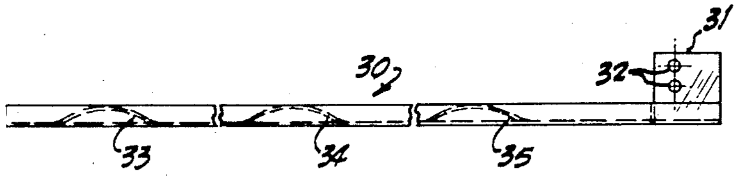

In greater detail, FIG. 4 shows that each of the detents is a strap of metal pierced at the sides and bent into an arcuate shape so that it stands up from the bottom of the channel. The ends of the strap are still attached at either end to provide a rigid mechanical structure. For convenience of expression, the term "semi-pierced" is used herein to describe this arrangement of cut sides and integral ends. It should be noted, however, that the word "semi-pierced" is not intended to limit the invention, but is intended to cover all reasonable equivalents—as where one end of the strap is cut away or where the sides of the straps are not cut away from the bottom of the channel.

Figure 5:
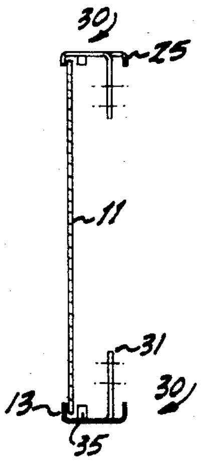

FIG. 5 shows the ends of the upper and lower guide bars 13, 25, with the printed circuit board held thereby. For purposes of identification, the U-shaped channel is identified as a heavily inked line. The mounting tab 31 and detent guide 35 are shown by lightly inked lines. The parallel and crosshatched lines identify the printed circuit board 11. An inspection of the drawing should make it apparent how the printed circuit board is supported between the edge of the U-shaped channel and the detent guide 35.

Each printed circuit board 11 conventionally ends in one or more conductors, such as 40 (FIG. 2), which may be used to complete electrical connections between conductive strips on the printed circuit board and the external equipment. Those who are skilled in the art will immediately perceive how these connections are made by sliding the printed circuit board along the guide ways and pressing the connectors 40 and 17 together.

The printed circuit board is keyed so that the wrong board may not be put into the connector 17. To provide this keying, the connectors 17 are attached at different heights to the vertical mounting rail 18. Under the foregoing assumptions that the perforations or row of holes in the mounting rail are two-tenths of an inch apart, the connector 17 may be raised or lowered in increments of two-tenths of an inch by the simple expedient of mounting the connector 17 in different holes in the rail 18. The mating connector 40, mounted on a printed circuit board, is raised or lowered in similar increments to a position where it will fit into the connector 17 when the printed circuit board is pushed to its home position. This way, it will not be possible to put the wrong printed circuit board into the wrong connector because the two parts 17, 40 will be at different heights.

If the two-tenths of an inch incremental vertical displacements do not provide a sufficient number of keying positions, further keying may be provided by using a plurality of smaller connectors 17 spaced away from each other by variable distances. Still further keying capacity may be obtained by inserting a non-conductive insulating spacer or T-pin 41 into any suitable socket in the connector 17. A notch 42 may then be cut into the printed circuit board connector 40 to preclude an insertion of the printed circuit card into any connector 17 if the T-pin 41 is in any socket other than the correct socket.

Upon reflection, it should be apparent that the inventive library rack may be made entirely from pieceparts cut from either of two standard stock parts plus a few sheet metal screws or rivets. One of these stock parts is the perforated U-shaped rail used to make the rails 18 and struts 21–24. The other of the two standard stock parts is the printed circuit board guide rails 13, 25. Since all of these parts are metal, there is no heat sinking, twisting, warping, turning, or the like, such as might be expected when some parts are plastic.

These are the only pieceparts required to make an entire library rack exclusive of the connectors and printed circuit boards which will, of course, vary from installation to installation. However, it should be further noted that the design is an extremely flexible one. While the entire library rack may be made in any convenient size from these two standard shapes, it is not rigidly limited thereto. Quite the contrary, there are no parts which must fit into notches, holes, or the like, on other parts. Thus, if the user wishes to achieve his own unique ends, there are no special problems. He may use thinner, narrower, longer, or shorter stock. Such parts may be used simply by a substitution or addition to other parts as long as the perforations match. Even there, the use of self-tapping screws allows a considerable leeway. If the holes do not match perfectly, within reasonable tolerances, the threads cut by the self-tapping screws will compensate for the missmatch. Moreover, the addition of the mounting blocks 16 enables the rack to be adapted to almost any type of ocnnector. Those skilled in the art will readily perceive still other advantages.

While the principles of the invention have been described above in connection with specific apparatus and applications, it is to be understood that this description is made only by way of example and not as a limitation on the scope of the invention.

I claim:

1. A library rack comprising a plurality of strut members arranged to provide a shelf for supporting printed circuit boards, some of said strut members serving the dual function of providing structural supporting struts and guide bars for printed circuit boards, each of the some of said strut members comprising an elongated piece of sheet metal having generally U-shaped cross-section with an upstanding tab on one end and a plurality of aligned, semi-pierced detent guides longitudinally positioned along the bottom of said U-shaped channel, each of said detents being spaced away from a side of said U-shaped channel by a distance which is approximately equal to the thickness of a printed circuit board, other of said strut members serving as horizontal shelf supports, and all of said strut members being similarly shaped with said some of said strut members having a different length than said other of said strut members.

2. A library rack comprising a plurality of strut members arranged to provide a shelf for supporting printed circuit boards, some of said strut members serving a dual function of providing structural supporting struts and guide bars for printed circuit boards, other of said strut members serving as horizontal shelf supports, said some of said strut members comprising an elongated piece of sheet metal having a generally U-shaped cross-section with an upstanding tab on one end and a plurality of aligned, semi-pierced detent guides longitudinally positioned along the bottom of said U-shaped channel, each of said detents being spaced away from a side of said U-shaped channel by a distance which is approximately equal to the thickness of a printed circuit board, all of said other of said strut members being cut from the same stock material and provided with a perforated row of holes spaced from each other by incremental distances equal to the minimum desired variation of the length of said library rack, a length of said other strut members being fastened between said upstanding paths, and means for attaching a connector at any of said incremental distances along said length of said other strut members in order to provide a keying of printed circuit boards in said rack.

References Cited

UNITED STATES PATENTS

| | | | |
|---|---|---|---|
| 504,279 | 8/1893 | Raymond | 211—41 |
| 2,986,281 | 5/1961 | Jordan | 211—41 |
| 3,184,069 | 5/1965 | Rosenberg | 211—41 |
| 3,197,731 | 7/1965 | Beale | 211—41 X |
| 3,231,785 | 1/1966 | Calabro | 339—17 |
| 3,349,924 | 10/1967 | Maurer | 211—41 X |
| 3,335,386 | 8/1967 | Upton | 339—45 |

CHANCELLOR E. HARRIS, Primary Examiner

U.S. Cl. X.R.

339—17; 211—162